US012771317B2

(12) United States Patent
Zhang et al.

(10) Patent No.: US 12,771,317 B2
(45) Date of Patent: Oct. 20, 2026

(54) BULK ACOUSTIC RESONATOR, ACOUSTIC FILTER, AND ELECTRONIC DEVICE

(71) Applicant: HUAWEI TECHNOLOGIES CO., LTD., Shenzhen (CN)

(72) Inventors: Benfeng Zhang, Shanghai (CN); Yulin Huang, Chengdu (CN); Xinyi Li, Shanghai (CN); Zongzhi Gao, Shanghai (CN); Hangtian Hou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 64 days.

(21) Appl. No.: 18/805,930

(22) Filed: Aug. 15, 2024

(65) Prior Publication Data

US 2024/0405745 A1 Dec. 5, 2024

Related U.S. Application Data

(63) Continuation of application No. PCT/CN2022/076829, filed on Feb. 18, 2022.

(51) Int. Cl.
*H03H 9/17* (2006.01)
*H03H 9/02* (2006.01)
*H03H 9/56* (2006.01)

(52) U.S. Cl.
CPC ........ *H03H 9/172* (2013.01); *H03H 9/02157* (2013.01); *H03H 9/02228* (2013.01); *H03H 9/568* (2013.01)

(58) Field of Classification Search
CPC ............... H03H 9/172; H03H 9/02157; H03H 9/02228; H03H 9/568; H03H 9/132; H03H 9/02125; H03H 9/173; H03H 9/175
See application file for complete search history.

(56) References Cited

U.S. PATENT DOCUMENTS 7,994,878 B2 * 8/2011 Isobe .................. H03H 9/0222 333/195
2009/0295508 A1 12/2009 Isobe et al.
2024/0213949 A1 * 6/2024 Daimon ............ H03H 9/02157

FOREIGN PATENT DOCUMENTS

CN 110048688 A * 7/2019 ............ H01L 24/05
CN 111010116 A 4/2020
(Continued)

OTHER PUBLICATIONS

Extended European Search Report in European Appln. No. 22926462.7, mailed on Mar. 12, 2025, 11 pages.
(Continued)

*Primary Examiner* — Andrea Lindgren Baltzell
*Assistant Examiner* — Kimberly E Glenn
(74) *Attorney, Agent, or Firm* — Fish & Richardson P.C.

(57) ABSTRACT

This application provides example bulk acoustic resonators, example acoustic filters, and example electronic devices. One example bulk acoustic resonator includes a piezoelectric material layer, an interdigital transducer, and a dielectric layer. The interdigital transducer is disposed on the piezoelectric material layer. The interdigital transducer includes a first busbar and a second busbar that are disposed opposite to each other, a plurality of first electrodes, and a plurality of second electrodes. The plurality of first electrodes sequentially protrude from the first busbar to the second busbar along an extension direction of the first busbar. The plurality of second electrodes sequentially protrude from the second busbar to the first busbar along an extension direction of the second busbar. The plurality of first electrodes and the plurality of second electrodes are sequentially arranged in a staggered manner between the first busbar and the second busbar.

20 Claims, 7 Drawing Sheets

(56) References Cited

FOREIGN PATENT DOCUMENTS

| | | | | | |
|---|---|---|---|---|---|
| CN | 113615083 | A | | 11/2021 | |
| JP | 2014207540 | A | * | 10/2014 | |
| WO | 2016017104 | A1 | | 2/2016 | |
| WO | 2021125013 | A1 | | 6/2021 | |
| WO | WO-2022233058 | A1 | * | 11/2022 | ............. H01L 23/28 |

OTHER PUBLICATIONS

Yandrapalli et al., "Analysis of XBAR resonance and higher order spurious modes," Proceedings of 2019 IEEE International Ultrasonics Symposium (IUS), Nov. 2019, 4 pages.

International Search Report and Written Opinion in International Appln. No. PCT/CN2022/076829, mailed on Nov. 10, 2022, 15 pages (with English translation).

* cited by examiner

BULK ACOUSTIC RESONATOR, ACOUSTIC FILTER, AND ELECTRONIC DEVICE

CROSS-REFERENCE TO RELATED APPLICATIONS

This application is a continuation of International Application No. PCT/CN2022/076829, filed on Feb. 18, 2022, the disclosure of which is hereby incorporated by reference in its entirety.

TECHNICAL FIELD

This application relates to the field of semiconductor technologies, and in particular, to a bulk acoustic resonator, an acoustic filter, and an electronic device.

BACKGROUND

As mobile communication develops and people's requirements for a communication speed are increasing, more frequency bands are used in a mobile communication system. An acoustic filter is an important component in the mobile communication system.

A conventional acoustic filter is a bottleneck for improving communication quality. With implementation of more communication modes and communication scenarios, acoustic filtering performance faces a greater challenge. Improving performance of an acoustic filter is currently a research focus and difficulty of the acoustic filter.

SUMMARY

Embodiments of this application provide a bulk acoustic resonator, an acoustic filter, and an electronic device, to improve performance of the acoustic filter.

To achieve the foregoing objective, this application uses the following technical solutions.

According to a first aspect, a bulk acoustic resonator is provided. The bulk acoustic resonator includes a piezoelectric material layer, an interdigital transducer, and a dielectric layer. The interdigital transducer is disposed on the piezoelectric material layer. The interdigital transducer includes a first busbar and a second busbar that are disposed opposite to each other, a plurality of first electrodes, and a plurality of second electrodes. The plurality of first electrodes sequentially protrude from the first busbar to the second busbar along an extension direction of the first busbar. The plurality of second electrodes sequentially protrude from the second busbar to the first busbar along an extension direction of the second busbar. The plurality of first electrodes and the plurality of second electrodes are sequentially arranged in a staggered manner between the first busbar and the second busbar. The dielectric layer covers the piezoelectric material layer and the interdigital transducer, and thicknesses of a part, of the dielectric layer, located between at least one pair of adjacent first electrode and second electrode fluctuate. The part, of the dielectric layer, whose thicknesses fluctuate is used to suppress excitation of a high-order mode during sound wave propagation.

In this application, because the thicknesses of the part, of the dielectric layer in the bulk acoustic resonator, located between the at least one pair of adjacent first electrode and second electrode fluctuate, when a sound wave is propagated between the first electrode and the second electrode, the part, of the dielectric layer, whose thicknesses fluctuate may destroy a periodicity of sound wave propagation, change a sound wave transmission characteristic, and therefore can suppress excitation of the high-order mode during sound wave propagation. This can excite a main mode of the bulk acoustic resonator, suppress a high-order spurious mode, reduce or avoid spurious resonance, and help improve performance of the acoustic filter and facilitate design of the acoustic filter.

In a possible implementation, along a direction in which the plurality of first electrodes and the plurality of second electrodes are sequentially arranged in the staggered manner, the thicknesses of the part, of the dielectric layer, located between the at least one pair of adjacent first electrode and second electrode are first decreased and then increased. Because the thicknesses of the part, of the dielectric layer, located between the at least one pair of adjacent first electrode and second electrode are first decreased and then increased, the part, of the dielectric layer, whose thicknesses are first decreased and then increased may destroy the periodicity of sound wave propagation, and therefore suppress excitation of the high-order mode during sound wave propagation. This reduces or avoids spurious resonance, and helps improve performance of the acoustic filter and facilitates design of the acoustic filter. On this basis, because the thicknesses of the part, of the dielectric layer, whose thicknesses fluctuate are distributed according to a specific rule, an electromechanical coupling coefficient of the main mode of the bulk acoustic resonator can be increased, and design difficulty of the dielectric layer can be simplified. In addition, a change rule of thicknesses of the dielectric layer can be selected according to a requirement, so that a design freedom of the dielectric layer can be improved.

In a possible implementation, along a direction in which the plurality of first electrodes and the plurality of second electrodes are sequentially arranged in the staggered manner, the thicknesses of the part, of the dielectric layer, located between the at least one pair of adjacent first electrode and second electrode are first increased and then decreased. Because the thicknesses of the part, of the dielectric layer, located between the at least one pair of adjacent first electrode and second electrode are first increased and then decreased, the part, of the dielectric layer, whose thicknesses are first increased and then decreased may destroy a periodicity of sound wave propagation, and therefore suppress excitation of the high-order mode during sound wave propagation. This reduces or avoids spurious resonance, and helps improve performance of the acoustic filter and facilitates design of the acoustic filter. On this basis, because the thicknesses of the part, of the dielectric layer, whose thicknesses fluctuate are distributed according to a specific rule, an electromechanical coupling coefficient of the main mode of the bulk acoustic resonator can be increased, and design difficulty of the dielectric layer can be simplified. In addition, a change rule of thicknesses of the dielectric layer can be selected according to a requirement, so that a design freedom of the dielectric layer can be improved.

In a possible implementation, the part, of the dielectric layer, located between the at least one pair of adjacent first electrode and second electrode includes a plurality of areas that are sequentially arranged along a direction in which the plurality of first electrodes and the plurality of second electrodes are sequentially arranged in the staggered manner, and along the direction in which the plurality of first electrodes and the plurality of second electrodes are sequentially arranged in the staggered manner, thicknesses of each area are first decreased and then increased, or first increased and then decreased. Because the thicknesses of each area in the part, of the dielectric layer, located between the at least one pair of adjacent first electrode and second electrode are first decreased and then increased, or first increased and then decreased, the dielectric layer of the plurality of areas may destroy a periodicity of sound wave propagation, and therefore suppress excitation of the high-order mode during sound wave propagation. This reduces or avoids spurious resonance, and helps improve performance of the acoustic filter and facilitates design of the acoustic filter. On this basis, because the thicknesses of each area in the part, of the dielectric layer, located between the at least one pair of adjacent first electrode and second electrode are distributed according to a specific rule, an electromechanical coupling coefficient of the main mode of the bulk acoustic resonator can be increased, and design difficulty of the dielectric layer can be simplified. In addition, a change rule of thicknesses of the dielectric layer can be selected according to a requirement, so that a design freedom of the dielectric layer can be improved.

In a possible implementation, a change rule of thicknesses of a part, of the dielectric layer, located between a first pair of adjacent first electrode and second electrode is different from a change rule of thicknesses of a part, of the dielectric layer, located between a second pair of adjacent first electrode and second electrode. This can further destroy the periodicity during sound wave propagation, suppress excitation of the high-order mode during sound wave propagation, and be more conducive to reducing or avoiding spurious resonance. In addition, a design freedom of the bulk acoustic resonator can be further enriched.

In a possible implementation, the first pair of adjacent first electrode and second electrode and the second pair of adjacent first electrode and second electrode share one of the first electrode or the second electrode, that is, the first pair of adjacent first electrode and second electrode and the second pair of adjacent first electrode and second electrode are disposed adjacently.

In a possible implementation, the bulk acoustic resonator further includes a substrate, the substrate is disposed on a side that is of the piezoelectric material layer and that is away from the interdigital transducer, and the substrate is enclosed in a ring. The substrate may play a supporting role, and is configured to support the piezoelectric material layer, the interdigital transducer, and the dielectric layer. On this basis, because the substrate is enclosed in the ring, a cavity structure can be formed. In a sound wave propagation process, the cavity structure can concentrate energy on the piezoelectric material layer. This can improve a quality factor of the bulk acoustic resonator. In addition, the substrate disposed in the bulk acoustic resonator can also implement process compatibility. For example, the acoustic filter may be bound to another electronic component like an integrated circuit component via the substrate.

In a possible implementation, the bulk acoustic resonator further includes a substrate and a reflection layer that are disposed in a stacked manner, and the reflection layer is disposed between the substrate and the piezoelectric material layer; and the reflection layer includes a first acoustic impedance layer and a second acoustic impedance layer that are alternately disposed in a stacked manner, and acoustic impedance of the first acoustic impedance layer is different from acoustic impedance of the second acoustic impedance layer. Because the reflection layer may reflect the sound wave to the piezoelectric material layer, energy can be concentrated on the piezoelectric material layer in the sound wave propagation process. This can improve the quality factor of the bulk acoustic resonator. On this basis, the substrate in the bulk acoustic resonator plays a supporting role, and is configured to support the reflection layer, the piezoelectric material layer, the interdigital transducer, and the dielectric layer. In addition, the substrate in the bulk acoustic resonator can also implement process compatibility. For example, the acoustic filter may be bound to another electronic component like an IC component via the substrate.

In a possible implementation, a material of the substrate includes one or more of silicon, silicon carbide, diamond, sapphire, or aluminum nitride.

In a possible implementation, a material of the dielectric layer includes one or more of silicon oxide, silicon nitride, silicon oxynitride, or aluminum oxide.

According to a second aspect, an acoustic filter is provided. The acoustic filter includes a plurality of cascaded bulk acoustic resonators, and the bulk acoustic resonator is the bulk acoustic resonator provided in the first aspect. Because the acoustic filter has same technical effect as the bulk acoustic resonator provided in the first aspect, for details, refer to related descriptions of the first aspect. Details are not described herein again.

According to a third aspect, an electronic device is provided. The electronic device includes an acoustic filter, a processor, and a printed circuit board, both the acoustic filter and the processor are disposed on the printed circuit board; and the acoustic filter is the acoustic filter provided in the second aspect. Because the electronic device has same technical effect as the bulk acoustic resonator provided in the first aspect, for details, refer to related descriptions of the first aspect. Details are not described herein again.

Figure 1:
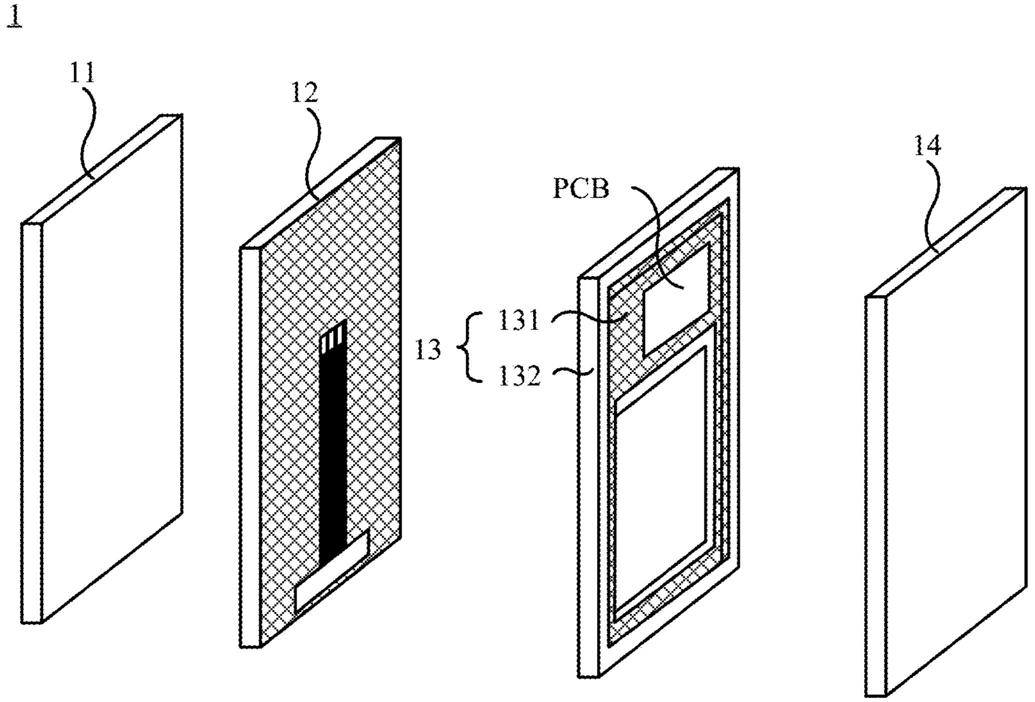
FIG. 1 is a diagram of a structure of an electronic device according to an embodiment of this application.

Reference numerals: 1—electronic device; 10—acoustic filter; 11—cover; 12—display; 13—middle frame; 14—rear housing; 100—bulk acoustic resonator; 101—piezoelectric material layer; 102—interdigital transducer; 103—dielectric layer; 104—substrate; 105—reflection layer; 131—bearing plate; 132—bezel; 1021*a*—first busbar; 1021*b*—first electrode; 1022*a*—second busbar; 1022*b*—second electrode; 1031*a*—area; 1051—first acoustic impedance layer; and 1052—second acoustic impedance layer.

DESCRIPTION OF EMBODIMENTS

The following describes technical solutions in embodiments of this application with reference to the accompanying drawings in embodiments of this application. It is clear that the described embodiments are merely some rather than all of embodiments of this application.

The terms such as "first" and "second", below are merely for convenience of description, and are not to be understood as indicating or implying relative importance or implicitly indicating a quantity of indicated technical features. Therefore, a feature limited by "first", "second", or the like may explicitly or implicitly include one or more features. In the descriptions of this application, unless otherwise stated, "a plurality of" means two or more than two.

In embodiments of this application, the word "example" or "for example" is used to represent giving an example, an illustration, or a description. Any embodiment or design scheme described as an "example" or "for example" in embodiments of this application should not be explained as being more preferred or having more advantages than another embodiment or design scheme. Exactly, use of the terms such as "example" or "for example" is intended to present a related concept in a specific manner.

In embodiments of this application, "and/or" describes an association relationship between associated objects, and represents that three relationships may exist. For example, A and/or B may represent the following cases: Only A exists, both A and B exist, and only B exists, where A and B may be singular or plural. The character "/" generally indicates an "or" relationship between the associated objects.

Embodiments of this application provide an electronic device. The electronic device may be different types of user equipment or terminal devices, for example, a mobile phone, a tablet computer (pad), a personal digital assistant (PDA), a television, an intelligent wearable product (for example, a smartwatch or a smart band), a virtual reality (VR) terminal device, an augmented reality (AR) terminal device, a charging home small appliance (for example, a bean pulp machine or a ground-sweeping robot), an uncrewed aerial vehicle, a radar, an aerospace device, and a vehicle-mounted device. A specific form of the electronic device is not specially limited in embodiments of this application.

For ease of description, the following uses an example in which the electronic device is a mobile phone for description. As shown in FIG. 1, an electronic device 1 mainly includes a cover 11, a display 12, a middle frame 13, and a rear housing 14. The rear housing 14 and the display 12 are respectively located on two sides of the middle frame 13, the middle frame 13 and the display 12 are disposed in the rear housing 14, the cover 11 is disposed on a side that is of the display 12 and that is away from the middle frame 13, and a display surface of the display 12 faces the cover 11.

The display 12 may be a liquid crystal display (LCD). In this case, the liquid crystal display includes a liquid crystal display panel and a backlight module. The liquid crystal display panel is disposed between the cover 11 and the backlight module, and the backlight module is configured to provide a light source for the liquid crystal display panel. The display 12 may alternatively be an organic light emitting diode (OLED) display. Because the OLED display is a self-luminous display, no backlight module needs to be disposed.

The middle frame 13 includes a bearing plate 131 and a bezel 132 around the bearing plate 131. The electronic device 1 may further include electronic components such as a printed circuit board (PCB), a battery, and a camera. The electronic components such as the printed circuit board, the battery, and the camera may be disposed on the bearing plate 131.

The electronic device 1 may further include a system on chip (SoC), a radio frequency chip, and the like that are disposed on the PCB. The PCB is configured to carry the system on chip, the radio frequency chip, and the like, and is electrically connected to the system on chip, the radio frequency chip, and the like. The radio frequency chip may include parts such as an acoustic filter and a processor. The processor is configured to process various signals. The acoustic filter is an important part of radio frequency signal processing, and is configured to block a signal of another frequency through a signal of a specific frequency.

Embodiments of this application provide an acoustic filter. The acoustic filter may be used in the electronic device 1, for example, used in the radio frequency chip in the electronic device 1. The acoustic filter provided in embodiments of this application may be, for example, a low-pass acoustic filter, a high-pass acoustic filter, a band-pass acoustic filter, a band-stop acoustic filter, or an active acoustic filter.

Figure 2:
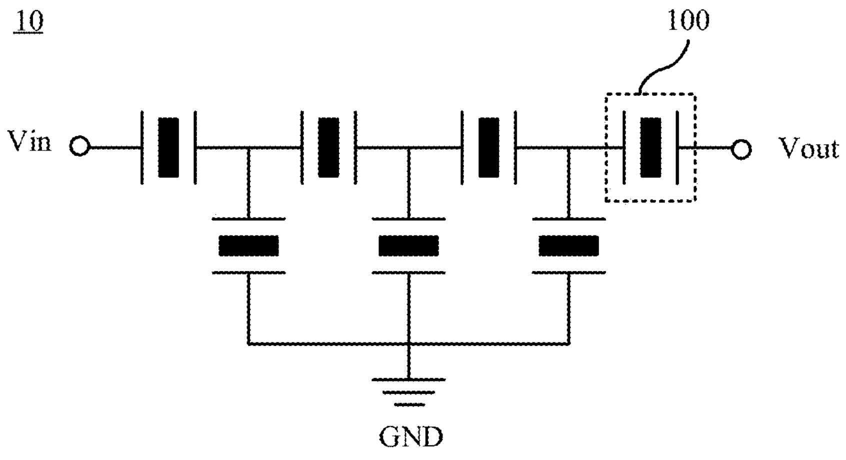
FIG. 2 is a diagram of a structure of an acoustic filter according to an embodiment of this application.

A ladder-type acoustic filter is of a topology structure commonly used by current acoustic filters. The acoustic filter provided in this embodiment of this application is the ladder-type acoustic filter. As shown in FIG. 2, an acoustic filter 10 provided in embodiments of this application includes a plurality of cascaded bulk acoustic wave (BAW) resonators 100. The plurality of bulk acoustic resonators 100 may have different resonance frequencies, and may be cascaded together in a serial-parallel manner. Refer to FIG. 2. When the plurality of bulk acoustic resonators 100 are cascaded together in the serial-parallel manner, FIG. 2 further shows a signal input end Vin, a signal output end Vout, and a ground end GND of the acoustic filter 10.

Here, the acoustic filter formed by the resonators that are cascaded in the serial-parallel manner and that are with the different resonance frequencies has advantages such as small passband insertion loss, high out-of-band steepness, and strong power tolerance.

Embodiments of this application further provide a bulk acoustic resonator. The bulk acoustic resonator 100 may be used in the acoustic filter 10. The following describes a structure of the bulk acoustic resonator 100 by using several embodiments as examples.

Embodiment 1

Figure 3A:
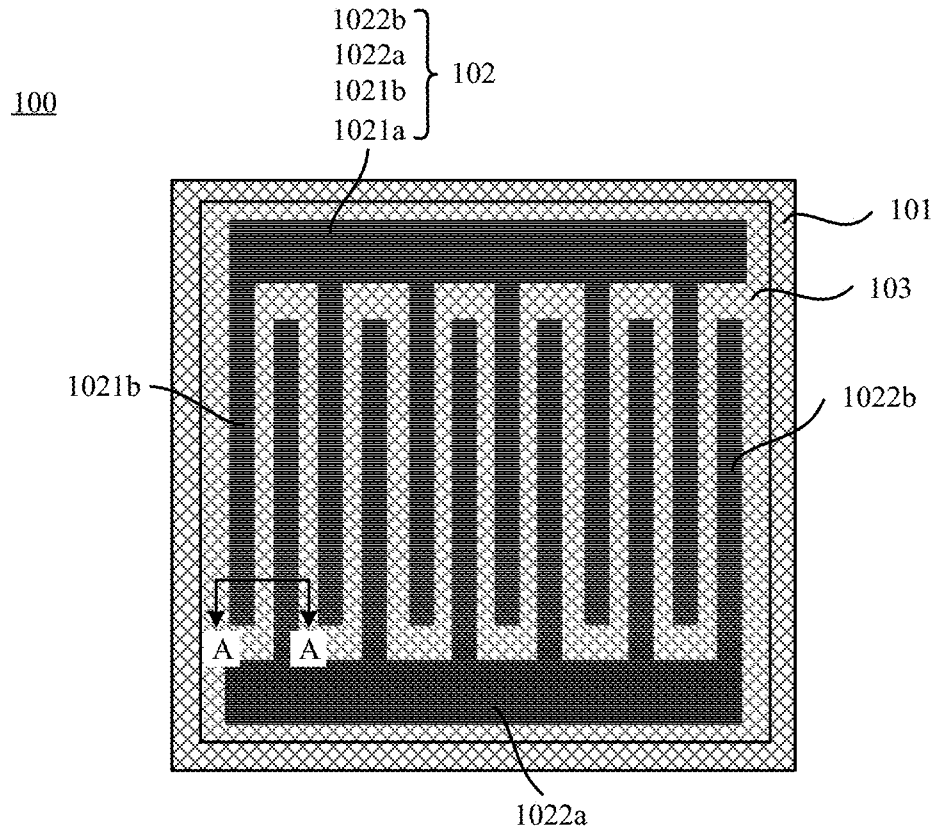
FIG. 3*a* is a diagram of a structure of a bulk acoustic resonator according to an embodiment of this application.
Figure 3B:
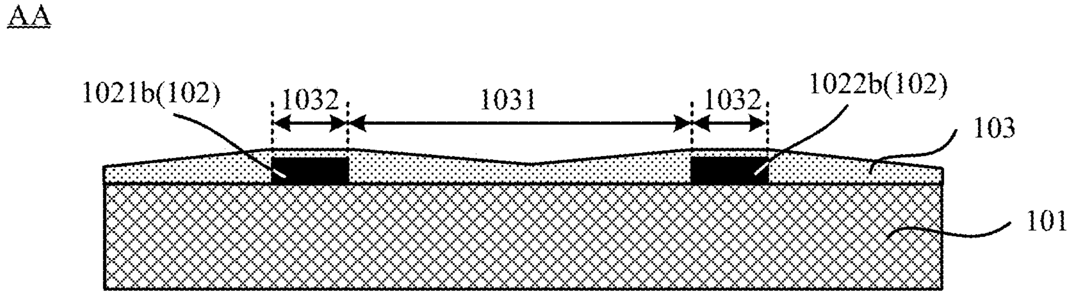
FIG. 3*b* is a cross-sectional diagram along an AA direction in FIG. 3*a*.

In Embodiment 1, as shown in FIG. 3*a* and FIG. 3*b*, a bulk acoustic resonator 100 includes a piezoelectric material layer 101, an interdigital transducer (IDT) 102, and a dielectric layer 103.

FIG. 3*a* is a diagram of a top view of a structure of the bulk acoustic resonator 100. FIG. 3*b* is a cross-sectional diagram along an AA direction in FIG. 3*a*.

Herein, a material of the piezoelectric material layer 101 may include, for example, one or more of $LiNbO_3$ (lithium niobate), $LiTaO_3$ (lithium tantalate), and the like.

It should be understood that a function of the piezoelectric material layer 101 is to generate inverse piezoelectric effect by converting electric energy into mechanical energy in a form of a sound wave. A resonator provided in this embodiment of this application is the bulk acoustic resonator. For the bulk acoustic resonator, a sound wave is mainly propagated in the piezoelectric material layer 101. Compared with that of a surface acoustic wave (SAW) resonator, a thickness of the piezoelectric material layer 101 in the bulk acoustic resonator is smaller. In this embodiment of this application, for example, the thickness of the piezoelectric material layer 101 may be (0, 2] μm, that is, the thickness of the piezoelectric material layer 101 is greater than 0 μm and less than or equal to 2 μm.

Figure 4:
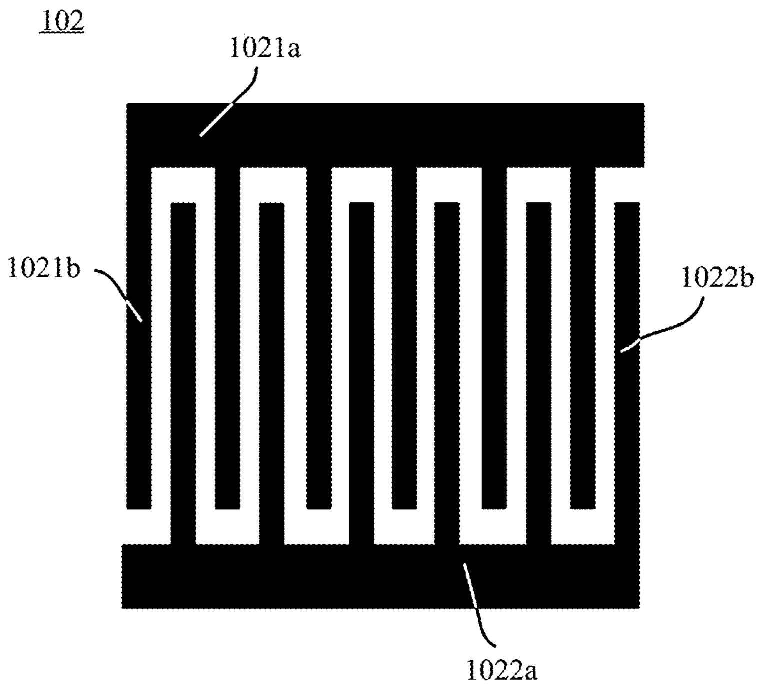
FIG. 4 is a diagram of a structure of an interdigital transducer according to an embodiment of this application.

Refer to FIG. 3*b*. The interdigital transducer 102 is disposed on the piezoelectric material layer 101. As shown in FIG. 4, the interdigital transducer 102 includes a first busbar 1021*a* and a second busbar 1022*a* that are disposed opposite to each other, a plurality of first electrodes (IDT electrodes) 1021*b*, and a plurality of second electrodes 1022*b*. The plurality of first electrodes 1021*b* sequentially protrude from the first busbar 1021*a* to the second busbar 1022*a* along an extension direction of the first busbar 1021*a*. The plurality of second electrodes 1022*b* sequentially protrude from the second busbar 1022*a* to the first busbar 1021*a* along an extension direction of the second busbar 1022*a*. The plurality of first electrodes 1021*b* and the plurality of second electrodes 1022*b* are sequentially arranged in a staggered manner between the first busbar 1021*a* and the second busbar 1022*a*, and the first electrode 1021*b* and the second electrode 1022*b* are not in contact with each other.

That "the plurality of first electrodes 1021*b* and the plurality of second electrodes 1022*b* are sequentially arranged in the staggered manner between the first busbar 1021*a* and the second busbar 1022*a*" indicates that one first electrode 1021*b*, one second electrode 1022*b*, one first electrode 1021*b*, one second electrode 1022*b*, one first electrode 1021*b*, one second electrode 1022*b*, and so on are sequentially disposed between the first busbar 1021*a* and the second busbar 1022*a*.

A quantity of first electrodes 1021*b* and a quantity of second electrodes 1022*b* in the interdigital transducer 102 are not limited, and may be set according to a requirement. The plurality of first electrodes 1021*b* may be arranged at an equal spacing, or may be arranged at a non-equal spacing. Similarly, the plurality of second electrodes 1022*b* may be arranged at an equal spacing, or may be arranged at a non-equal spacing. The first electrode 1021*b* is used as an example. That the plurality of first electrodes are 1021*b* are arranged at a non-equal spacing means that a spacing between at least one pair of adjacent first electrodes 1021*b* is different from a spacing between another pair of adjacent first electrodes 1021*b*.

In addition, that the plurality of first electrodes 1021*b* and the plurality of second electrodes 1022*b* are sequentially arranged in the staggered manner may indicate that spacings between the adjacent first electrodes 1021*b* and the second electrodes 1022*b* are the same; or may indicate that spacings between a plurality of pairs of adjacent first electrodes 1021*b* and second electrodes 1022*b* are not totally the same, that is, a spacing between at least one pair of adjacent first electrode 1021*b* and second electrode 1022*b* is different from a spacing between another pair of adjacent first electrode 1021*b* and second electrode 1022*b*.

It should be noted that the first busbar 1021*a*, the first electrode 1021*b*, the second busbar 1022*a*, and the second electrode 1022*b* may be manufactured simultaneously; or the first busbar 1021*a* and the first electrode 1021*b* may be manufactured first, and then the second busbar 1022*a* and the second electrode 1022*b* are manufactured; or the second busbar 1022*a* and the second electrode 1022*b* are first manufactured, and then the first busbar 1021*a* and the first electrode 1021*b* are manufactured.

In addition, a material of the interdigital transducer 102 may be, for example, one or more of Al (aluminum), Mo (molybdenum), W (tungsten), Ru (ruthenium), Cu (copper), and Pt (platinum).

Still refer to FIG. 3*b*. The dielectric layer 103 covers the piezoelectric material layer 101 and the interdigital transducer 102, thicknesses of a part, of the dielectric layer 103, located between at least one pair of adjacent first electrode 1021*b* and second electrode 1022*b* fluctuate, and the part, of the dielectric layer 103, whose thicknesses fluctuate is used to suppress excitation of a high-order mode during sound wave propagation. As shown in FIG. 3*b*, the part, of the dielectric layer 103, whose thicknesses fluctuate and that is located between the pair of adjacent first electrode 1021*b* and second electrode 1022*b* is marked by 1031.

A material of the dielectric layer 103 may include, for example, one or more of silicon oxide (SiOx), silicon nitride (SiNx), silicon oxynitride (SiOxNy), or aluminum oxide ($Al_2O_3$).

It should be noted that, it may be that thicknesses of the dielectric layer 103 between one pair of adjacent first electrode 1021*b* and second electrode 1022*b* fluctuate; or thicknesses of the dielectric layer 103 between a plurality of pairs of adjacent first electrodes 1021*b* and second electrodes 1022*b* fluctuate.

Herein, that the thicknesses of the part, of the dielectric layer 103, located between the pair of adjacent first electrode 1021*b* and second electrode 1022*b* fluctuate may be understood as that all thicknesses of the dielectric layer 103 located between the pair of adjacent first electrode 1021*b* and second electrode 1022*b* fluctuate; or may be understood as that some thicknesses of the dielectric layer 103 located between the pair of adjacent first electrode 1021*b* and second electrode 1022*b* fluctuate, and some thicknesses remain unchanged. On this basis, if the thicknesses of the part, of the dielectric layer 103, located between the pair of adjacent first electrode 1021*b* and second electrode 1022*b* fluctuate, the fluctuated part may be a continuous whole, or may include a plurality of discontinuous sub-parts.

On this basis, in addition to the part located between the adjacent first electrode 1021*b* and the second electrode 1022*b*, the dielectric layer 103 further includes a part located above the first electrode 1021*b* or the second electrode 1022*b*. In FIG. 3*b*, the part located above the first electrode 1021*b* or the second electrode 1022*b* in the dielectric layer 103 is illustrated by 1032. The part 1032 located above the first electrode 1021*b* or the second electrode 1022*b* overlaps with the first electrode 1021*b* or the second electrode 1022*b* in a direction perpendicular to the piezoelectric material layer 101.

Figure 5A:
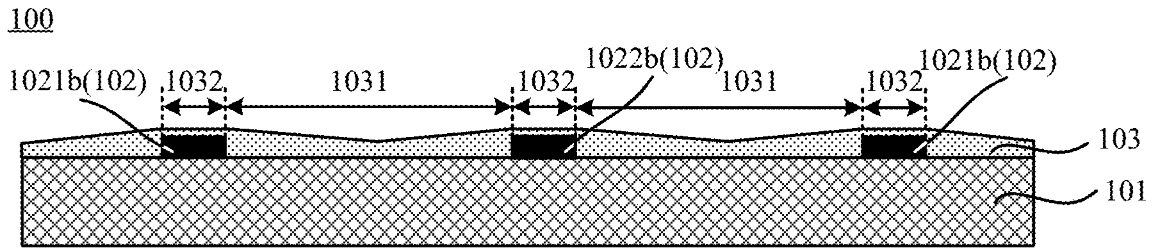
FIG. 5*a* is a diagram of a structure of a bulk acoustic resonator according to another embodiment of this application.
Figure 5B:
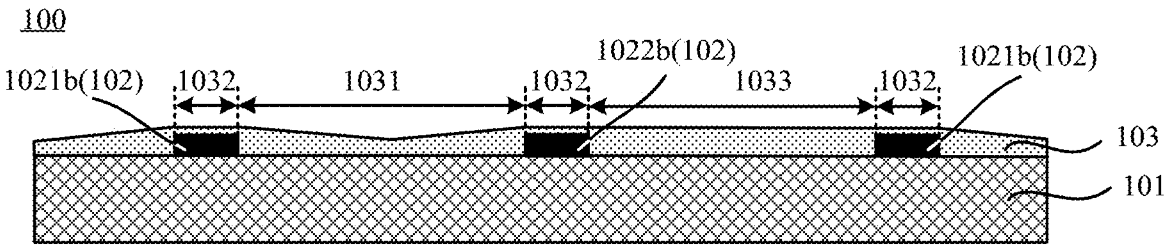
FIG. 5*b* is a diagram of a structure of a bulk acoustic resonator according to still another embodiment of this application.

Herein, thicknesses of the part 1032 above the first electrode 1021*b* or the second electrode 1022*b* may be totally the same, that is, the thicknesses do not fluctuate; or thicknesses of the part 1032 above the first electrode 1021*b* or the second electrode 1022*b* may fluctuate. It should be understood that, in some examples, as shown in FIG. 5*a*, thicknesses of a part, of the dielectric layer 103, located between each pair of adjacent first electrode 1021*b* and second electrode 1022*b* fluctuate. In some other examples, as shown in FIG. 5*b*, thicknesses of a part, of the dielectric layer 103, located between at least one pair of adjacent first electrode 1021*b* and second electrode 1022*b* fluctuate, and thicknesses of a part, of the dielectric layer 103, located between at least one pair of first electrode 1021*b* and second electrode 1022*b* do not fluctuate, that is, thicknesses of a part, of the dielectric layer 103, located in at least one pair of adjacent first electrode 1021*b* and second electrode 1022*b* are the same. As shown in FIG. 5*b*, the part, of the dielectric layer 103, whose thicknesses do not fluctuate and that is located between one pair of adjacent first electrode 1021*b* and second electrode 1022*b* is marked by 1033.

Herein, it may be that thicknesses of the dielectric layer 103 between one pair of adjacent first electrode 1021*b* and second electrode 1022*b* do not fluctuate; or thicknesses of the dielectric layer 103 between a plurality of pairs of adjacent first electrodes 1021*b* and second electrodes 1022*b* do not fluctuate.

As mobile communication develops and people's requirements for a communication speed are increasing, more and more frequency bands are used in a mobile communication system. As important frequency bands in a 5G communication system, N77 and N79 have characteristics such as a high working frequency and a large bandwidth. In particular, an operating frequency band of the N77 frequency band is 3300 MHz to 4200 MHZ, and a bandwidth ratio is 24%. A ladder-type filter has advantages of small passband insertion loss, high out-of-band steepness, and strong power tolerance. Therefore, a filter of a frequency band below 3 GHz is mainly of a ladder-type topology formed by cascading a surface acoustic wave (SAW) resonator, a film bulk acoustic resonator (FBAR), or a solidly mounted bulk acoustic resonator (SMR). In view of the bandwidth ratio 24% of the N77 frequency band, the resonator that forms the ladder-type filter needs to have an electromechanical coupling coefficient of more than 25% to meet a bandwidth requirement of the N77 frequency band.

However, a current surface acoustic wave resonator, film bulk acoustic resonator, and solidly mounted bulk acoustic resonator cannot meet the requirement. The bulk acoustic resonator provided in this embodiment of this application is an excited film bulk acoustic resonator (excited film bulk acoustic resonator, XBAR). The bulk acoustic resonator provided in this embodiment of this application excites an A1 lamb (lam) wave on the piezoelectric material layer 101, so that the bulk acoustic resonator 100 has an electromechanical coupling coefficient of 25%, and therefore can meet the requirement of the N77 frequency band.

Figure 6:
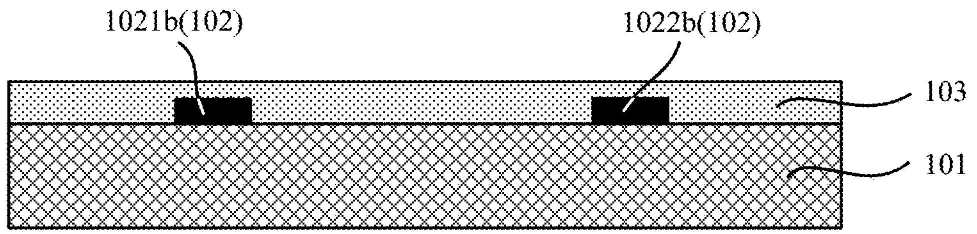
FIG. 6 is a diagram of a structure of a bulk acoustic resonator according to the related technology.

FIG. 6 shows the XBAR according to a related technology. As shown in FIG. 6, the XBAR includes the piezoelectric material layer 101, the interdigital transducer 102, and the dielectric layer 103. The interdigital transducer 102 is disposed on the piezoelectric material layer 101. For a structure of the interdigital transducer 102, refer to the foregoing descriptions. Details are not described herein again. The dielectric layer 103 covers the interdigital transducer 102. Thicknesses of the dielectric layer 103 located between the adjacent first electrode index 1021*b* and the second electrode index 1022*b* do not fluctuate, that is, thicknesses are the same. The bulk acoustic resonator 100 provided in FIG. 6 excites the A1 lamb wave on the piezoelectric material layer 101. Although the bulk acoustic resonator 100 may have the electromechanical coupling coefficient of 25%, and can therefore meet the requirement of the N77 frequency band, the bulk acoustic resonator 100 provided in FIG. 6 has another body wave mode and an A1 high-order mode, which causes a severe spurious mode and severely restricts design and performance of the acoustic filter 10. After preparation of the bulk acoustic resonator 100 in the acoustic filter 10 is completed, an admittance curve corresponding to the bulk acoustic resonator 100 is usually obtained through testing via a vector network analyzer, and the admittance curve may represent various indexes of the bulk acoustic resonator 100.

Figure 7:
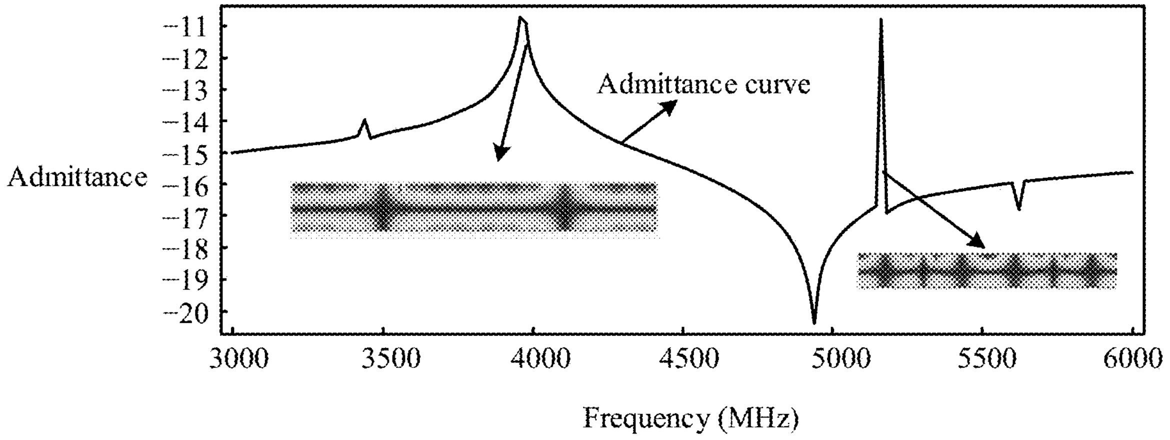
FIG. 7 is a diagram of an admittance curve corresponding to the bulk acoustic resonator shown in FIG. 6.

FIG. 7 shows the admittance curve corresponding to the bulk acoustic resonator 100 shown in FIG. 6. In FIG. 7, a horizontal coordinate represents a frequency, and a vertical coordinate represents admittance. Refer to FIG. 7, a resonance frequency and an anti-resonance frequency of the bulk acoustic resonator 100 are 3960 MHz and 4940 MHz respectively. Refer to FIG. 7. It can be further seen that, in addition to including main resonance, the bulk acoustic resonator 100 further has other spurious resonance. For example, spurious resonance exists at a frequency of 5160 MHz. FIG. 7 further shows a displacement field distribution diagram corresponding to a main mode and a spurious mode. It can be seen from the displacement field distribution diagram that the main mode is an A1 lamb mode, namely, a low-order mode. In FIG. 7, the spurious mode at the frequency of 5160 MHz is caused by a high-order mode formed by a sound wave between the first electrode 1021*b* and the second electrode 1022*b*. The spurious resonance severely affects performance of the acoustic filter 10 and restricts design of the acoustic filter 10. It can be seen from the displacement field distribution diagram corresponding to the spurious mode in FIG. 7 that the high-order mode formed between the first electrode 1021*b* and the second electrode 1022*b* is excited because the sound wave meets a high-order resonance condition when being propagated in a constant transmission characteristic area between the first electrode 1021*b* and the second electrode 1022*b*.

However, in this Embodiment 1, because the thicknesses of the part, of the dielectric layer 103 in the bulk acoustic resonator 100, located between the at least one pair of adjacent first electrode 1021*b* and second electrode 1022*b* fluctuate, when the sound wave is propagated between the first electrode 1021*b* and the second electrode 1022*b*, the part, of the dielectric layer 103, whose thicknesses fluctuate may destroy a periodicity of propagation, change a sound wave transmission characteristic, and therefore can suppress excitation of the high-order mode during sound wave propagation. This can excite the main mode of the bulk acoustic resonator 100, suppress the high-order spurious mode, reduce or avoid spurious resonance, and help improve performance of the acoustic filter 10 and facilitate design of the acoustic filter 10.

Figure 8:
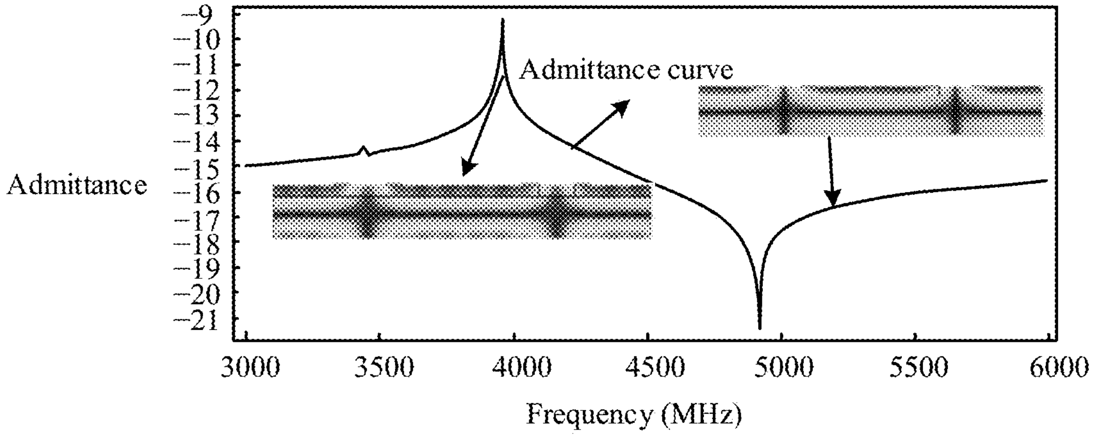
FIG. 8 is a diagram of an admittance curve corresponding to the bulk acoustic resonator shown in FIG. 3*b*.

FIG. 8 shows an admittance curve corresponding to the bulk acoustic resonator 100 provided in FIG. 3*b* according to this embodiment of this application. In FIG. 8, a horizontal coordinate represents a frequency, and a vertical coordinate represents admittance. Refer to FIG. 8, a resonance frequency and an anti-resonance frequency of the bulk acoustic resonator 100 are 3960 MHz and 4940 MHz respectively. It can be seen from comparison between FIG. 7 and FIG. 8 that the admittance curve shown in FIG. 8 has no other spurious resonance except the main mode. FIG. 8 further shows a displacement field distribution diagram corresponding to the main mode and a spurious resonance frequency in FIG. 7. It can be seen from the displacement field distribution diagram in FIG. 8 that, in the bulk acoustic resonator 100 provided in FIG. 3*b*, only the main mode is excited, and a high-order spurious mode is suppressed.

On this basis, it should be noted that, when the thicknesses of the part, of the dielectric layer 103, located between the at least one pair of adjacent first electrode 1021*b* and second electrode 1022*b* fluctuate, the thicknesses of the part, of the dielectric layer 103, located between the at least one pair of adjacent first electrode 1021*b* and second electrode 1022*b* may be distributed according to a specific change rule, or may be distributed irregularly. When the thicknesses of the part, of the dielectric layer 103, located between the at least one pair of adjacent first electrode 1021*b* and second electrode 1022*b* are distributed according to the specific change rule, the following provides several implementations by using examples.

In a first implementation, as shown in FIG. 3*b*, along a direction in which the plurality of first electrodes 1021*b* and the plurality of second electrodes 1022*b* are sequentially arranged in the staggered manner, the thicknesses of the part, of the dielectric layer 103, located between the at least one pair of adjacent first electrode 1021*b* and second electrode 1022*b* are first decreased and then increased.

Figure 9:
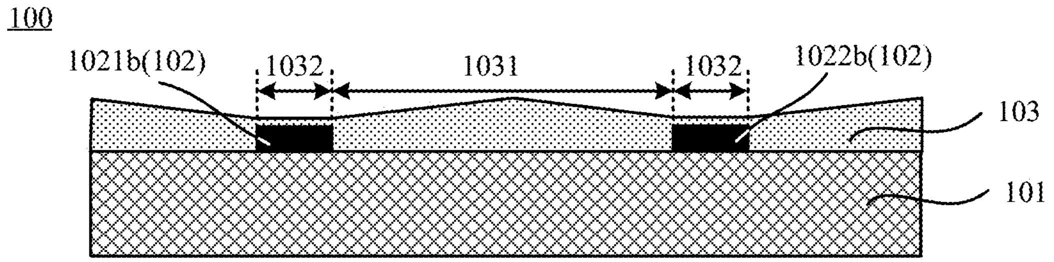
FIG. 9 is a diagram of a structure of a bulk acoustic resonator according to still another embodiment of this application.

In a second implementation, as shown in FIG. 9, along a direction in which the plurality of first electrodes 1021*b* and the plurality of second electrodes 1022*b* are sequentially arranged in the staggered manner, the thicknesses of the part, of the dielectric layer 103, located between the at least one pair of first electrode 1021*b* and second electrode 1022*b* are first increased and then decreased.

Figure 10A:
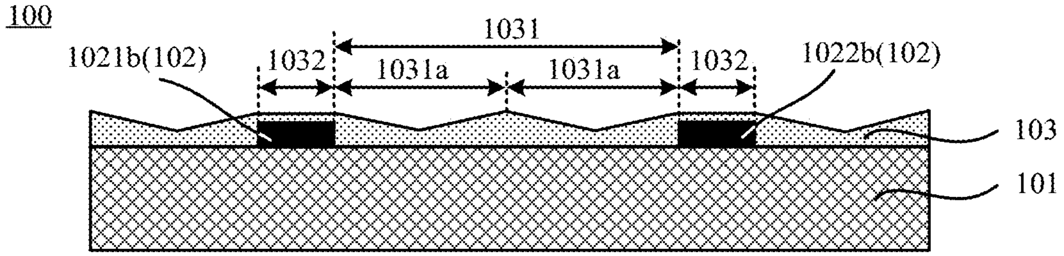
FIG. 10*a* is a diagram of a structure of a bulk acoustic resonator according to still another embodiment of this application.

In a third implementation, as shown in FIG. 10*a*, the part, of the dielectric layer 103, located between the at least one pair of adjacent first electrode 1021*b* and second electrode 1022*b* includes a plurality of areas 1031*a* that are sequentially arranged along a direction in which the plurality of first electrodes 1021*b* and the plurality of second electrodes 1022*b* are sequentially arranged in the staggered manner, and along the direction in which the plurality of first electrodes 1021*b* and the plurality of second electrodes 1022*b* are sequentially arranged in the staggered manner, thicknesses of each area 1031*a* are first decreased and then increased.

Figure 10B:
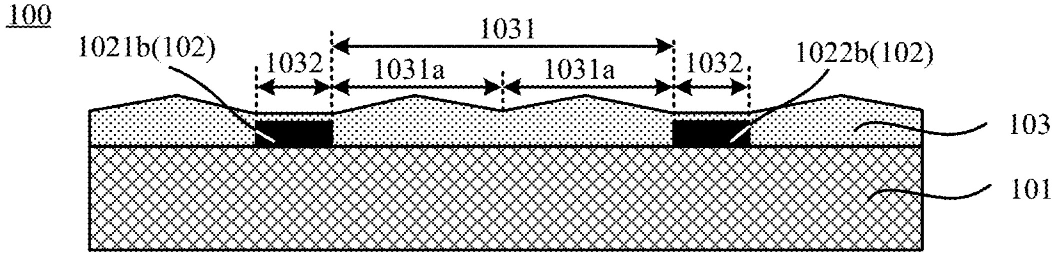
FIG. 10*b* is a diagram of a structure of a bulk acoustic resonator according to still another embodiment of this application.

In a fourth implementation, as shown in FIG. 10*b*, the part, of the dielectric layer 103, located between the at least one pair of adjacent first electrode 1021*b* and second electrode 1022*b* includes a plurality of areas 1031*a* that are sequentially arranged along a direction in which the plurality of first electrodes 1021*b* and the plurality of second electrodes 1022*b* are sequentially arranged in the staggered manner, and along the direction in which the plurality of first electrodes 1021*b* and the plurality of second electrodes 1022*b* are sequentially arranged in the staggered manner, thicknesses of each area 1031*a* are first increased and then decreased.

In the third implementation and the fourth implementation, a quantity of areas 1031*a* included in the part, of the dielectric layer 103, located between the at least one pair of adjacent first electrode 1021*b* and second electrode 1022*b* may be set according to a requirement. In FIG. 10*a* and FIG. 10*b*, an example in which the part, of the dielectric layer 103, located between the at least one pair of adjacent first electrode 1021*b* and second electrode 1022*b* includes two areas 103 la is used for illustration.

Figure 11A:
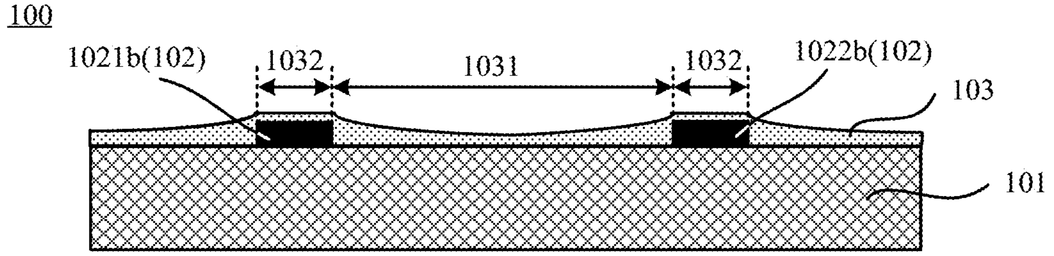
FIG. 11*a* is a diagram of a structure of a bulk acoustic resonator according to still another embodiment of this application.
Figure 11B:
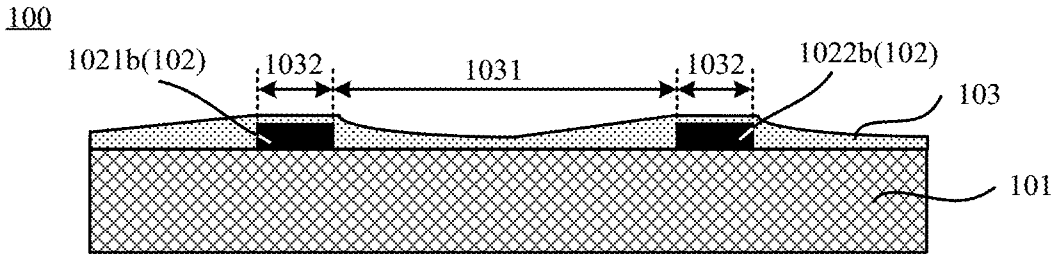
FIG. 11*b* is a diagram of a structure of a bulk acoustic resonator according to still another embodiment of this application.

It should be noted that, in the first, second, third, and fourth implementations, a surface that is of the part, of the dielectric layer 103, whose thicknesses fluctuate and that is far away from the piezoelectric material layer 101 may be formed by a plurality of planes, or may be formed by a plurality of arc surfaces, or certainly may be formed by at least one plane and at least one arc surface. The first implementation is used as an example. In FIG. 3*b*, the surface that is of the part, of the dielectric layer 103, whose thicknesses fluctuate and that is far away from the piezoelectric material layer 101 is formed by a plurality of planes. In FIG. 11*a*, a surface that is of the part, of the dielectric layer 103, whose thicknesses fluctuate and that is far away from the piezoelectric material layer 101 is formed by a plurality of arc surfaces. In FIG. 11*b*, a surface that is of the part, of the dielectric layer 103, whose thicknesses fluctuate and that is far away from the piezoelectric material layer 101 is formed by at least one plane and at least one arc surface.

In addition, when a surface that is of the part, of the dielectric layer 103, whose thicknesses fluctuate and that is far away from the piezoelectric material layer 101 includes an arc surface, the arc surface may protrude in a direction away from the piezoelectric material layer 101, or may be concave in a direction close to the piezoelectric material layer 101. In FIG. 11*a* and FIG. 11*b*, an example in which the arc is concave in a direction close to the piezoelectric material layer 101 is used for illustration.

When the thicknesses of the part, of the dielectric layer 103, located between the at least one pair of adjacent first electrode 1021*b* and second electrode 1022*b* are changed in a rule in the first, second, third, or fourth implementation, because the thicknesses of the part, of the dielectric layer 103, located between the at least one pair of adjacent first electrode 1021*b* and second electrode 1022*b* fluctuate, the part, of the dielectric layer 103, whose thicknesses change may destroy a periodicity of sound wave propagation, and therefore suppress excitation of the high-order mode during sound wave propagation. This reduces or avoids spurious resonance, and helps improve performance of the acoustic filter 10 and facilitates design of the acoustic filter 10. On this basis, because the thicknesses of the part, of the dielectric layer 103, whose thicknesses change are distributed according to a specific rule, an electromechanical coupling coefficient of the main mode of the bulk acoustic resonator 100 can be increased, and design difficulty of the dielectric layer 103 can be simplified. In addition, the first, the second, the third, or the fourth implementation may be selected according to a requirement, so that a design freedom of the dielectric layer 103 can be improved.

When the thicknesses of the part, of the dielectric layer 103, located between the at least one pair of adjacent first electrode 1021*b* and second electrode 1022*b* are changed according to the specific rule, when the dielectric layer 103 is designed, a point in the bulk acoustic resonator 100 may be used as an origin, and a thickness at a position of the dielectric layer 103 is a function of a distance x from the position to the origin along the direction in which the plurality of first electrodes 1021*b* and the plurality of second electrodes 1022*b* are sequentially arranged in the staggered manner, that is, $f_h$=f (x), where $f_h$ is the thickness at the position of the dielectric layer 103.

Figure 12:
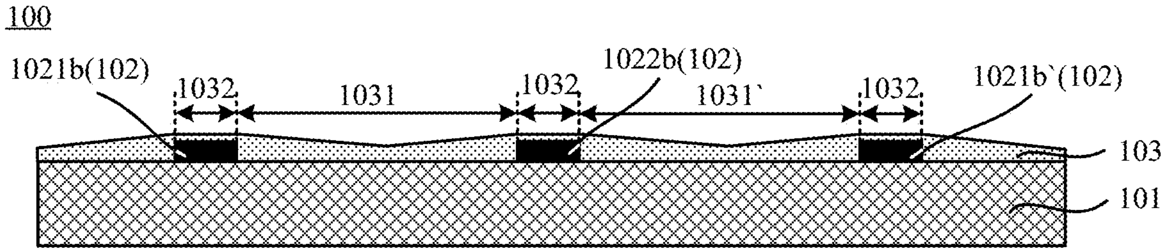
FIG. 12 is a diagram of a structure of a bulk acoustic resonator according to still another embodiment of this application.

When thicknesses of parts, of the dielectric layer 103, located between a plurality of pairs of adjacent first electrodes 1021*b* and second electrodes 1022*b* fluctuate, in some examples, change rules of the thicknesses of the dielectric layer 103 between the plurality of pairs of adjacent first electrodes 1021*b* and second electrodes 1022*b* are the same. For example, as shown in FIG. 12, a change rule of thicknesses of a part 1031, of the dielectric layer 103, located between the adjacent first electrode 1021*b* and the second electrode 1022*b* is the same as a change rule of thicknesses of a part 1031', of the dielectric layer 103, located between a first electrode 1021*b*' and the second electrode 1022*b* that are adjacent. Along the direction in which the plurality of first electrodes 1021*b* and the plurality of second electrodes 1022*b* are sequentially arranged in the staggered manner, the change rule of the thicknesses of the part 1031, of the dielectric layer 103, located between the adjacent first electrode 1021*b* and the second electrode 1022*b* and the change rule of the thicknesses of the part 1031', of the dielectric layer 103, located between the adjacent first electrode 1021*b*' and the second electrode 1022*b* are first decreased and then increased.

When the change rules of the thicknesses of the dielectric layer 103 between the plurality of pairs of adjacent first electrodes 1021*b* and second electrodes 1022*b* are the same, a manufacturing process of the dielectric layer 103 can be simplified, and further, a manufacturing process of the bulk acoustic resonator 100 can be simplified.

In some other examples, change rules of the thicknesses of the dielectric layer 103 between the plurality of pairs of adjacent first electrodes 1021*b* and second electrodes 1022*b* are not totally the same. It should be understood that, “the change rules of the thicknesses of the dielectric layer 103 between the plurality of pairs of adjacent first electrodes 1021*b* and second electrodes 1022*b* are not totally the same” may be that the change rules of the thicknesses of the dielectric layer 103 between the plurality of pairs of adjacent first electrodes 1021*b* and second electrodes 1022*b* are not the same; or change rules of thicknesses of the dielectric layer 103 between some pairs of adjacent first electrodes 1021*b* and second electrodes 1022*b* are the same, and change rules of thicknesses of the dielectric layer 103 between some pairs of adjacent first electrodes 1021*b* and second electrodes 1022*b* are different. When the change rules of the thicknesses of the dielectric layer 103 between the plurality of pairs of adjacent first electrodes 1021*b* and second electrodes 1022*b* are not totally the same, a change rule of thicknesses of a part, of the dielectric layer 103, located between a first pair of adjacent first electrode 1021*b* and second electrode 1022*b* is different from a change rule of thicknesses of a part, of the dielectric layer 103, located between a second pair of adjacent first electrode 1021*b* and second electrode 1022*b*.

Figure 13:
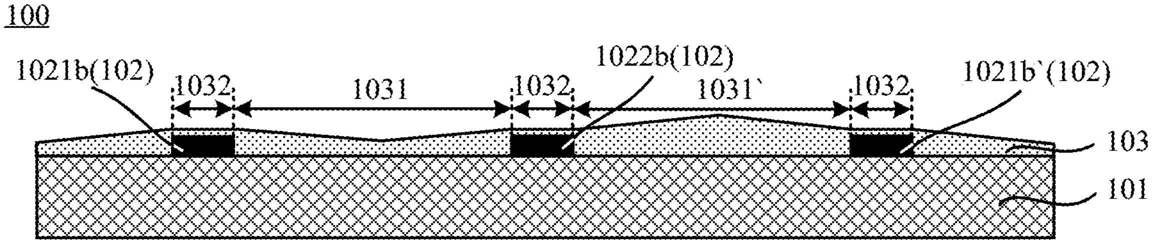
FIG. 13 is a diagram of a structure of a bulk acoustic resonator according to still another embodiment of this application.

For example, as shown in FIG. 13, a change rule of thicknesses of a part, of the dielectric layer 103, located between a first pair of adjacent first electrode 1021*b* and second electrode 1022*b*, namely, 1031 in FIG. 13, is that, along the direction in which the plurality of first electrodes 1021*b* and the plurality of second electrodes 1022*b* are sequentially arranged in the staggered manner, the thicknesses of the part, of the dielectric layer 103, located between the first pair of adjacent first electrode 1021*b* and second electrode 1022*b*, namely, 1031 in FIG. 13, are first decreased and then increased. A change rule of thicknesses of a part, of the dielectric layer 103, located between a second pair of adjacent first electrode 1021*b*' and second electrode 1022*b*, namely, 1031' in FIG. 13, is that, along the direction in which the plurality of first electrodes 1021*b* and the plurality of second electrodes 1022*b* are sequentially arranged in the staggered manner, the thicknesses of the part, of the dielectric layer 103, located between the second pair of adjacent first electrode 1021*b*' and second electrode 1022*b*, namely, 1031' in FIG. 13, are first increased and then decreased.

Figure 14:
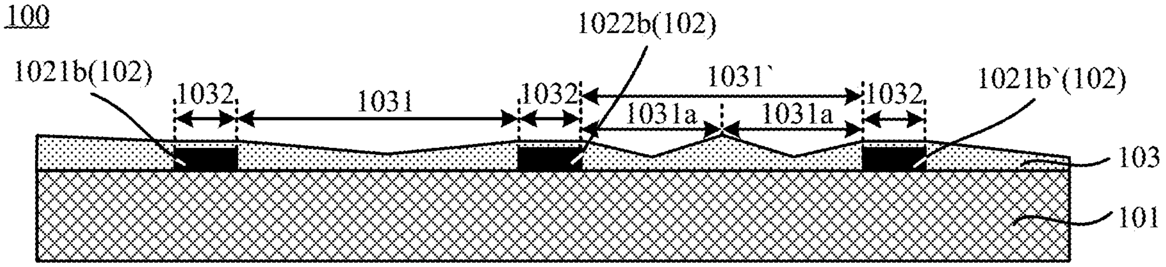
FIG. 14 is a diagram of a structure of a bulk acoustic resonator according to still another embodiment of this application.

For another example, as shown in FIG. 14, a change rule of thicknesses of a part, of the dielectric layer 103, located between a first pair of adjacent first electrode 1021*b* and second electrode 1022*b*, namely, 1031 in FIG. 14, is that, along the direction in which the plurality of first electrodes 1021*b* and the plurality of second electrodes 1022*b* are sequentially arranged in the staggered manner, the thicknesses of the part, of the dielectric layer 103, located between the first pair of adjacent first electrode 1021*b* and second electrode 1022*b*, namely, 1031 in FIG. 14, are first decreased and then increased. A part, of the dielectric layer 103, located between a second pair of adjacent first electrode 1021*b*' and second electrode 1022*b*, namely, 1031' in FIG. 14, includes a plurality of areas 1031*a* that are sequentially arranged along the direction in which the plurality of first electrodes 1021*b* and the plurality of second electrodes 1022*b* are sequentially arranged in the staggered manner, and along the direction in which the plurality of first electrodes 1021*b* and the plurality of second electrodes 1022*b* are sequentially arranged in the staggered manner, thicknesses of each area 1031*a* are first decreased and then increased.

When the change rule of the thicknesses of the part, of the dielectric layer 103, located between the first pair of adjacent first electrode 1021*b* and second electrode 1022*b* is different from the change rule of the thicknesses of the part, of the dielectric layer 103, located between the second pair of adjacent first electrode 1021*b* and second electrode 1022*b*, this can further destroy the periodicity during sound wave propagation, suppress excitation of the high-order mode during sound wave propagation, and be more conducive to reducing or avoiding spurious resonance. In addition, the design freedom of the bulk acoustic resonator 100 can be further enriched.

On this basis, it may be that the first pair of adjacent first electrode 1021*b* and second electrode 1022*b* and the second pair of adjacent first electrode 1021*b* and second electrode 1022*b* share one of the first electrode 1021*b* or the second electrode 1022*b*, that is, the first pair of adjacent first electrode 1021*b* and second electrode 1022*b* and the second pair of adjacent first electrode 1021*b* and second electrode 1022*b* are disposed adjacently. It may alternatively be that the first pair of adjacent first electrode 1021*b* and second electrode 1022*b* and the second pair of adjacent first electrode 1021*b* and second electrode 1022*b* do not share one of the first electrode 1021*b* or the second electrode 1022*b*, that is, the first pair of adjacent first electrode 1021*b* and second electrode 1022*b* and the second pair of adjacent first electrode 1021*b* and second electrode 1022*b* are not disposed adjacently.

Embodiment 2

A difference between Embodiment 2 and Embodiment 1 lies in that, compared with that in Embodiment 1, a substrate is added in Embodiment 2.

A bulk acoustic resonator 100 provided in Embodiment 2 includes a piezoelectric material layer 101, an interdigital transducer 102, a dielectric layer 103, and the substrate, where the piezoelectric material layer 101, the interdigital transducer 102, and the dielectric layer 103 are fastened to the substrate. For the piezoelectric material layer 101, the interdigital transducer 102, and the dielectric layer 103, refer to related descriptions in Embodiment 1. Details are not described again in Embodiment 2. Embodiment 2 describes only a part different from that in Embodiment 1, that is, only the substrate is described.

Figure 15:
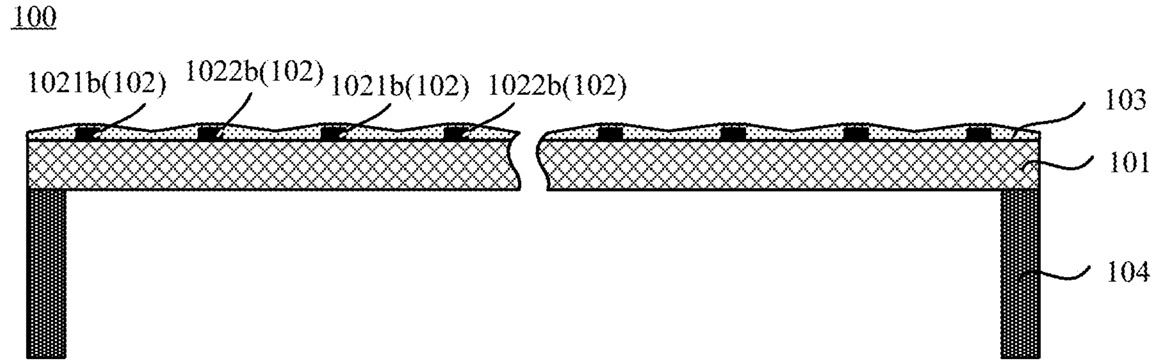
FIG. 15 is a diagram of a structure of a bulk acoustic resonator according to still another embodiment of this application.
Figure 16:
FIG. 16 is a diagram of a structure of a substrate according to an embodiment of this application.

In Embodiment 2, as shown in FIG. 15, the bulk acoustic resonator 100 further includes the substrate 104, where the substrate 104 is disposed on a side that is of the piezoelectric material layer 101 and that is away from the interdigital transducer 102. As shown in FIG. 16, the substrate 104 is enclosed in a ring. FIG. 15 is a sectional view of the bulk acoustic resonator 100. FIG. 16 is a top view of the substrate 104.

Herein, the ring enclosed by the substrate 104 may be, for example, a circular ring, a square ring, another regular ring, or an irregular ring. It may be understood that a specific shape of the ring may be designed based on a shape of a graph enclosed by a boundary of the piezoelectric material layer 101.

In some examples, a material of the substrate 104 is a high sound rate material, and the high sound rate material may include, for example, one or more of silicon (Si), silicon carbide (SiC), diamond, sapphire, aluminum nitride (AlN), and the like.

The substrate 104 is disposed in the bulk acoustic resonator 100, and the substrate 104 may play a supporting role, and is configured to support the piezoelectric material layer 101, the interdigital transducer 102, and the dielectric layer 103. On this basis, because the substrate 104 is enclosed in the ring, a cavity structure can be formed. In a sound wave propagation process, the cavity structure can concentrate energy on the piezoelectric material layer 101. This can improve a quality factor of the bulk acoustic resonator 100. In addition, the substrate 104 disposed in the bulk acoustic resonator 100 can also implement process compatibility. For example, the acoustic filter 10 may be bound to another electronic component like an integrated circuit (IC) component via the substrate 104.

Embodiment 3

A difference between Embodiment 3 and Embodiment 1 lies in that, compared with that in Embodiment 1, a substrate and a reflection layer are added in Embodiment 3.

A bulk acoustic resonator 100 provided in Embodiment 3 includes a piezoelectric material layer 101, an interdigital transducer 102, a dielectric layer 103, the substrate, and the reflection layer, where the piezoelectric material layer 101, the interdigital transducer 102, and the dielectric layer 103 are fastened to the substrate and the reflection layer. For the piezoelectric material layer 101, the interdigital transducer 102, and the dielectric layer 103, refer to related descriptions in Embodiment 1. Details are not described again in Embodiment 3. Embodiment 3 describes only a part different from that in Embodiment 1, that is, only the substrate and the reflection layer are described.

Figure 17:
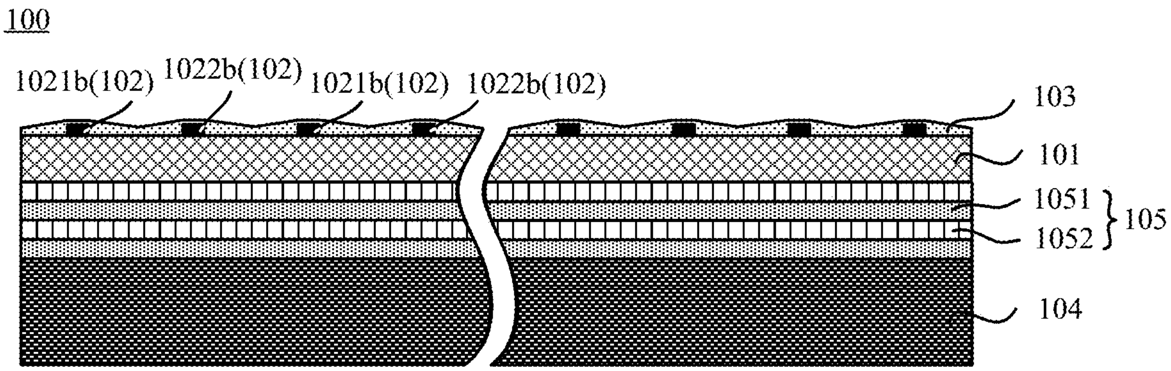
FIG. 17 is a diagram of a structure of a bulk acoustic resonator according to still another embodiment of this application.

In Embodiment 3, as shown in FIG. 17, the bulk acoustic resonator 100 further includes the substrate 104 and the reflection layer 105 that are disposed in a stacked manner, and the reflection layer 105 is disposed between the substrate 104 and the piezoelectric material layer 101; and the reflection layer 105 includes a first acoustic impedance layer 1051 and a second acoustic impedance layer 1052 that are alternately disposed in a stacked manner, and acoustic impedance of the first acoustic impedance layer 1051 is different from acoustic impedance of the second acoustic impedance layer 1052.

Herein, a quantity of disposed layers of both the first acoustic impedance layer 1051 and the second acoustic impedance layer 1052 in the reflection layer 105 is not limited, and may be set according to a requirement. A quantity of layers of the first acoustic impedance layer 1051 may be the same as or different from a quantity of layers of the second acoustic impedance layer 1052. In addition, in the reflection layer 105, the first acoustic impedance layer 1051 or the second acoustic impedance layer 1052 may be closest to the piezoelectric material layer 101. Similarly, in the reflection layer 105, the first acoustic impedance layer 1051 or the second acoustic impedance layer 1052 may be closest to the substrate 104.

In addition, acoustic impedance of the first acoustic impedance layer 1051 may be greater than acoustic impedance of the second acoustic impedance layer 1052, or acoustic impedance of the second acoustic impedance layer 1052 may be greater than acoustic impedance of the first acoustic impedance layer 1051.

In some examples, a material of the substrate 104 is a high sound rate material, and the high sound rate material may include, for example, one or more of silicon, silicon carbide, diamond, sapphire, aluminum nitride, and the like.

In Embodiment 3, the bulk acoustic resonator 100 includes the reflection layer 105. Because the reflection layer 105 may reflect a sound wave to the piezoelectric material layer 101, energy can be concentrated on the piezoelectric material layer 101 in the sound wave propagation process. This can improve a quality factor of the bulk acoustic resonator 100. On this basis, the substrate 104 in the bulk acoustic resonator 100 plays a supporting role, and is configured to support the reflection layer 105, the piezoelectric material layer 101, the interdigital transducer 102, and the dielectric layer 103. In addition, the substrate 104 in the bulk acoustic resonator 100 can also implement process compatibility. For example, the acoustic filter 10 may be bound to another electronic component like an IC component via the substrate 104.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A bulk acoustic resonator, comprising a piezoelectric material layer, an interdigital transducer, and a dielectric layer, wherein the interdigital transducer is disposed on the piezoelectric material layer, and the interdigital transducer comprises:
   - a first busbar and a second busbar that are disposed opposite to each other;
   - a plurality of first electrodes, wherein the plurality of first electrodes sequentially protrude from the first busbar to the second busbar along an extension direction of the first busbar; and
   - a plurality of second electrodes, wherein the plurality of second electrodes sequentially protrude from the second busbar to the first busbar along an extension direction of the second busbar, wherein:

the plurality of first electrodes and the plurality of second electrodes are sequentially arranged in a staggered manner between the first busbar and the second busbar;

the dielectric layer covers the piezoelectric material layer and the interdigital transducer, and thicknesses of a part, of the dielectric layer, located between at least one pair of adjacent first electrode and second electrode fluctuate; and a change rule of thicknesses of a part, of the dielectric layer, located between a first pair of adjacent first electrode and second electrode is different from a change rule of thicknesses of a part, of the dielectric layer, located between a second pair of adjacent first electrode and second electrode.

2. The bulk acoustic resonator according to claim 1, wherein along a direction in which the plurality of first electrodes and the plurality of second electrodes are sequentially arranged in the staggered manner, the thicknesses of the part, of the dielectric layer, located between the at least one pair of adjacent first electrode and second electrode are first decreased and then increased.

3. The bulk acoustic resonator according to claim 1, wherein along a direction in which the plurality of first electrodes and the plurality of second electrodes are sequentially arranged in the staggered manner, the thicknesses of the part, of the dielectric layer, located between the at least one pair of adjacent first electrode and second electrode are first increased and then decreased.

4. The bulk acoustic resonator according to claim 1, wherein the part, of the dielectric layer, located between the at least one pair of adjacent first electrode and second electrode comprises a plurality of areas that are sequentially arranged along a direction in which the plurality of first electrodes and the plurality of second electrodes are sequentially arranged in the staggered manner, and along the direction in which the plurality of first electrodes and the plurality of second electrodes are sequentially arranged in the staggered manner, thicknesses of each area are first decreased and then increased, or first increased and then decreased.

5. The bulk acoustic resonator according to claim 1, wherein the first pair of adjacent first electrode and second electrode and the second pair of adjacent first electrode and second electrode share one of the first electrode or the second electrode.

6. The bulk acoustic resonator according to claim 1, wherein the bulk acoustic resonator further comprises a substrate, the substrate is disposed on a side of the piezoelectric material layer, the side of the piezoelectric material layer is away from the interdigital transducer, and the substrate is enclosed in a ring.

7. The bulk acoustic resonator according to claim 1, wherein:

the bulk acoustic resonator further comprises a substrate and a reflection layer that are disposed in a stacked manner, and the reflection layer is disposed between the substrate and the piezoelectric material layer; and the reflection layer comprises a first acoustic impedance layer and a second acoustic impedance layer that are alternately disposed in a stacked manner, and acoustic impedance of the first acoustic impedance layer is different from acoustic impedance of the second acoustic impedance layer.

8. The bulk acoustic resonator according to claim 6, wherein a material of the substrate comprises one or more of silicon, silicon carbide, diamond, sapphire, or aluminum nitride.

9. The bulk acoustic resonator according to claim 1, wherein a material of the dielectric layer comprises one or more of silicon oxide, silicon nitride, silicon oxynitride, or aluminum oxide.

10. An acoustic filter, comprising a plurality of cascaded bulk acoustic resonators, wherein a bulk acoustic resonator of the plurality of cascaded bulk acoustic resonators comprises a piezoelectric material layer, an interdigital transducer, and a dielectric layer, wherein the interdigital transducer is disposed on the piezoelectric material layer, and the interdigital transducer comprises:

a first busbar and a second busbar that are disposed opposite to each other;

a plurality of first electrodes, wherein the plurality of first electrodes sequentially protrude from the first busbar to the second busbar along an extension direction of the first busbar; and a plurality of second electrodes, wherein the plurality of second electrodes sequentially protrude from the second busbar to the first busbar along an extension direction of the second busbar, wherein:

the plurality of first electrodes and the plurality of second electrodes are sequentially arranged in a staggered manner between the first busbar and the second busbar;

the dielectric layer covers the piezoelectric material layer and the interdigital transducer, and thicknesses of a part, of the dielectric layer, located between at least one pair of adjacent first electrode and second electrode fluctuate; and a change rule of thicknesses of a part, of the dielectric layer, located between a first pair of adjacent first electrode and second electrode is different from a change rule of thicknesses of a part, of the dielectric layer, located between a second pair of adjacent first electrode and second electrode.

11. The acoustic filter according to claim 10, wherein along a direction in which the plurality of first electrodes and the plurality of second electrodes are sequentially arranged in the staggered manner, the thicknesses of the part, of the dielectric layer, located between the at least one pair of adjacent first electrode and second electrode are first decreased and then increased.

12. The acoustic filter according to claim 10, wherein along a direction in which the plurality of first electrodes and the plurality of second electrodes are sequentially arranged in the staggered manner, the thicknesses of the part, of the dielectric layer, located between the at least one pair of adjacent first electrode and second electrode are first increased and then decreased.

13. The acoustic filter according to claim 10, wherein the part, of the dielectric layer, located between the at least one pair of adjacent first electrode and second electrode comprises a plurality of areas that are sequentially arranged along a direction in which the plurality of first electrodes and the plurality of second electrodes are sequentially arranged in the staggered manner, and along the direction in which the plurality of first electrodes and the plurality of second electrodes are sequentially arranged in the staggered manner, thicknesses of each area are first decreased and then increased, or first increased and then decreased.

14. The acoustic filter according to claim 10, wherein the first pair of adjacent first electrode and second electrode and the second pair of adjacent first electrode and second electrode share one of the first electrode or the second electrode.

15. The acoustic filter according to claim 10, wherein the bulk acoustic resonator further comprises a substrate, the substrate is disposed on a side of the piezoelectric material layer, the side of the piezoelectric material layer is away from the interdigital transducer, and the substrate is enclosed in a ring.

16. An electronic device, comprising an acoustic filter, a processor, and a printed circuit board, wherein both the acoustic filter and the processor are disposed on the printed circuit board, and wherein the acoustic filter comprises a plurality of cascaded bulk acoustic resonators, wherein a bulk acoustic resonator of the plurality of cascaded bulk acoustic resonators comprises a piezoelectric material layer, an interdigital transducer, and a dielectric layer, wherein the interdigital transducer is disposed on the piezoelectric material layer, and the interdigital transducer comprises:

a first busbar and a second busbar that are disposed opposite to each other;

a plurality of first electrodes, wherein the plurality of first electrodes sequentially protrude from the first busbar to the second busbar along an extension direction of the first busbar; and a plurality of second electrodes, wherein the plurality of second electrodes sequentially protrude from the second busbar to the first busbar along an extension direction of the second busbar, wherein:

the plurality of first electrodes and the plurality of second electrodes are sequentially arranged in a staggered manner between the first busbar and the second busbar;

the dielectric layer covers the piezoelectric material layer and the interdigital transducer, and thicknesses of a part, of the dielectric layer, located between at least one pair of adjacent first electrode and second electrode fluctuate; and a change rule of thicknesses of a part, of the dielectric layer, located between a first pair of adjacent first electrode and second electrode is different from a change rule of thicknesses of a part, of the dielectric layer, located between a second pair of adjacent first electrode and second electrode.

17. The electronic device according to claim 16, wherein along a direction in which the plurality of first electrodes and the plurality of second electrodes are sequentially arranged in the staggered manner, the thicknesses of the part, of the dielectric layer, located between the at least one pair of adjacent first electrode and second electrode are first decreased and then increased.

18. The electronic device according to claim 16, wherein along a direction in which the plurality of first electrodes and the plurality of second electrodes are sequentially arranged in the staggered manner, the thicknesses of the part, of the dielectric layer, located between the at least one pair of adjacent first electrode and second electrode are first increased and then decreased.

19. The electronic device according to claim 16, wherein the part, of the dielectric layer, located between the at least one pair of adjacent first electrode and second electrode comprises a plurality of areas that are sequentially arranged along a direction in which the plurality of first electrodes and the plurality of second electrodes are sequentially arranged in the staggered manner, and along the direction in which the plurality of first electrodes and the plurality of second electrodes are sequentially arranged in the staggered manner, thicknesses of each area are first decreased and then increased, or first increased and then decreased.

20. The electronic device according to claim 16, wherein the first pair of adjacent first electrode and second electrode and the second pair of adjacent first electrode and second electrode share one of the first electrode or the second electrode.

* * * * *